US010360992B2

(12) United States Patent
Kim et al.

(10) Patent No.: US 10,360,992 B2
(45) Date of Patent: Jul. 23, 2019

(54) TEST DEVICES AND TEST SYSTEMS

(71) Applicant: Samsung Electronics Co., Ltd., Suwon-si, Gyeonggi-do (KR)

(72) Inventors: Dong-Gun Kim, Hwaseong-si (KR); Je-Young Park, Yongin-si (KR); Byung-Soo Moon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 389 days.

(21) Appl. No.: 15/157,799

(22) Filed: May 18, 2016

(65) Prior Publication Data

US 2017/0053712 A1  Feb. 23, 2017

(30) Foreign Application Priority Data

Aug. 18, 2015 (KR) .................. 10-2015-0116264

(51) Int. Cl.
*G11C 5/14* (2006.01)
*G11C 29/56* (2006.01)
(Continued)

(52) U.S. Cl.
CPC .. *G11C 29/56008* (2013.01); *G11C 29/56004* (2013.01); *G01R 17/00* (2013.01); *G01R 19/0084* (2013.01); *G01R 31/2884* (2013.01); *G01R 31/31715* (2013.01); *G01R 31/31908* (2013.01); *G06F 11/26* (2013.01); *G06F 11/263* (2013.01); *G06F 11/277* (2013.01); *G11C 5/147* (2013.01); *G11C 29/08* (2013.01); *G11C 29/10* (2013.01); *G11C 29/12* (2013.01); *G11C 29/12005* (2013.01); *G11C 29/50* (2013.01); *G11C 29/50004* (2013.01)

(58) Field of Classification Search
CPC ... G11C 29/12005; G11C 29/50; G11C 29/12; G11C 29/08; G11C 29/10; G11C 29/50004; G11C 5/147; G11C 29/56004; G11C 29/56008; G01R 31/2884; G01R 31/31715; G01R 31/31908; G01R 17/00; G01R 19/0084; G06F 11/26; G06F 11/263; G06F 11/27
See application file for complete search history.

(56) References Cited

U.S. PATENT DOCUMENTS 5,623,498 A * 4/1997 Pannone ............. G06F 11/3672
375/224
6,016,566 A  1/2000 Yoshida
(Continued)

FOREIGN PATENT DOCUMENTS

JP  2002-022798 A  1/2002
JP  2004-053285 A  2/2004
(Continued)

*Primary Examiner* — April Y Blair
*Assistant Examiner* — Sazzad Hossain
(74) *Attorney, Agent, or Firm* — Harness, Dickey & Pierce, P.L.C.

(57) ABSTRACT

A test device includes a data driver and a controller. The controller is configured to generate a test code by dividing a test sequence in a unit of n-bits. The data driver is configured to receive the generated test code and output one of input voltages to a device under test as a test signal based on the generated test code. A storage device stores a test sequence.

19 Claims, 9 Drawing Sheets

(51) Int. Cl.
    *G01R 19/00*     (2006.01)
    *G11C 29/50*     (2006.01)
    *G11C 29/08*     (2006.01)
    *G01R 31/317*     (2006.01)
    *G06F 11/263*     (2006.01)
    *G11C 29/12*     (2006.01)
    *G01R 31/28*     (2006.01)
    *G11C 29/10*     (2006.01)
    *G06F 11/277*     (2006.01)
    *G01R 31/319*     (2006.01)
    *G06F 11/26*     (2006.01)
    *G01R 17/00*     (2006.01)

(56) References Cited

U.S. PATENT DOCUMENTS

| | | |
|---|---|---|
| 7,765,449 B2 | 7/2010 | Doi |
| 8,471,599 B2 | 6/2013 | Lee et al. |
| 2006/0087307 A1 | 4/2006 | De Winter |
| 2007/0103998 A1* | 5/2007 | Ishikawa ............ G11C 29/4401 365/200 |
| 2010/0207797 A1* | 8/2010 | Bien .................. H03M 1/0604 341/155 |
| 2012/0002491 A1 | 1/2012 | Choi |
| 2012/0110382 A1* | 5/2012 | Tang .................... G06F 11/263 714/32 |
| 2012/0331346 A1* | 12/2012 | Oshima ............ G01R 31/31919 714/32 |

FOREIGN PATENT DOCUMENTS

| | | |
|---|---|---|
| JP | 2008-232685 A | 10/2008 |
| JP | 4729212 B2 | 7/2011 |

* cited by examiner

163

| TR_CODE | DETL2 | DETL1 | DETH1 | DETH2 |
|---------|-------|-------|-------|-------|
| 11      | L     | L     | H     | H     |
| 10      | L     | L     | H     | L     |
| 01      | L     | H     | L     | L     |
| 00      | H     | H     | L     | L     |

TEST DEVICES AND TEST SYSTEMS

CROSS-REFERENCE TO RELATED APPLICATION

This application claims priority under 35 USC § 119 to Korean Patent Application No. 10-2015-0116264, filed on Aug. 18, 2015 in the Korean Intellectual Property Office (KIPO), the contents of which are herein incorporated by reference in its entirety.

BACKGROUND

1. Field

Example embodiments relate to testing of semiconductor devices, and more particularly to test devices, which perform an electrical test of semiconductor devices, and/or test systems, which include the test devices.

2. Description of the Related Art

A semiconductor test device is an automated device, which combines hardware and software functionalities for performing an electrical test of a semiconductor device.

Storage capacity of semiconductor devices, such as dynamic random access memories (DRAMs), has significantly increased in recent years. As the storage capacity of semiconductor devices increases, time required to perform electrical tests on the semiconductor devices also increases.

SUMMARY

Example embodiments of inventive concepts are directed towards providing test devices having increased test speeds.

Example embodiments of inventive concepts are directed towards providing test systems including test devices.

According to at least some example embodiments, a test device includes a storage device, a data driver, a comparison circuit, an analysis circuit, and a controller. The storage device may store a test sequence. The controller may generate a test code having n-bits based on the stored test sequence, n being an integer greater than or equal to two. The data driver may output one of first through ($2^n$)-th input voltages through a data pin to a device under test as a test signal, the first through ($2^n$)-th input voltages based on the test code generated by the controller. The comparison circuit may generate first through ($2^n$)-th comparison signals based on a comparison between a received test result signal and each of first through ($2^n$)-th comparison voltages. The analysis circuit may generate a test result code having n-bits based on the first through ($2^n$)-th comparison signals generated by the comparison circuit. The controller may further determine a corrupt area of the device under test based on the n-bits of the test result code.

In at least example embodiments, the test device may further include a voltage generator, which may be configured to generate the first through ($2^n$)-th input voltages and the first through ($2^n$)-th comparison voltages.

In at least some example embodiments, the first through ($2^n$)-th input voltages may include first through ($2^{(n-1)}$)-th high input voltages and first through ($2^{(n-1)}$)-th low input voltages, and the first through ($2^n$)-th comparison voltages may include first through ($2^{(n-1)}$)-th high comparison voltages and first through ($2^{(n-1)}$)-th low comparison voltages. The k-th of the first through ($2^{(n-1)}$)-th high comparison voltages may be lower than a k-th high input voltage, and the k-th of the first through ($2^{(n-1)}$)-th low comparison voltages may be higher than a k-th low input voltage. Here, k is a positive integer less than equal to $2^{(n-1)}$.

The first through ($2^{(n-1)}$)-th high input voltages may be different from each other by a first voltage difference, the first through ($2^{(n-1)}$)-th low input voltages may be different from each other by a second voltage difference, the first through ($2^{(n-1)}$)-th high comparison voltages may be different from each other by a third voltage difference, and the first through ($2^{(n-1)}$)-th low comparison voltages may be different from each other by a fourth voltage difference.

The comparison circuit may include first through ($2^{(n-1)}$)-th high comparators and first through ($2^{(n-1)}$)-th low comparators. The k-th of the first through ($2^{(n-1)}$)-th high comparator may output a k-th of the first through ($2^{(n-1)}$)-th high comparison signal having a first logic level when the test result signal is greater than or equal to the k-th high comparison voltage, and output the k-th high comparison signal having a second logic level when the test result signal is lower than the k-th high comparison voltage. The k-th of the first through ($2^{(n-1)}$)-th low comparator may output a k-th of the first through ($2^{(n-1)}$)-th low comparison signal having the first logic level when the test result signal is less than or equal to the k-th low comparison voltage, and output the k-th low comparison signal having the second logic level when the test result signal is higher than the k-th low comparison voltage. The first through ($2^n$)-th comparison signals may include the first through ($2^{(n-1)}$)-th high comparison signals and the first through ($2^{(n-1)}$)-th low comparison signals.

In at least some example embodiments, the analysis circuit may include a buffer circuit and a decoder. The buffer circuit may output the first through ($2^n$)-th determination signals based on (i) the first through ($2^n$)-th comparison signals generated by the comparison circuit, and (ii) an active strobe signal outputted by the controller. The decoder may generate the test result code corresponding to a voltage level of the test result signal based on logic levels of the first through ($2^n$)-th determination signals.

In example embodiments, the controller may determine the corrupt area of the device under test based on a comparison between the n-bits of the test result code and the n-bits of the test code.

The controller is further configured to determine the corrupt area of the device under test if a m-th bit of the test result code is different from a m-th bit of the test code. Here, m is a positive integer less than or equal to n.

In example embodiments, the test device may further include a drive channel configured to output a command signal, an address signal, and a clock signal to the device under test.

The drive channel may include a command driver, an address driver and a clock driver. The command driver may be configured to output the command signal to the device under test via a command pin. The address driver may be configured to output the address signal to the device under test via an address pin. The clock driver configured to output the clock signal to the device under test via a clock pin.

The controller may output a write command and a test address to the drive channel, and provide the test code to the data driver. The command signal corresponds to one of a read command and a write command, the address signal represents a test address. The controller may be further configured to output the test code to the data driver, and receive the test result code from the analysis circuit.

The controller may be further configured to determine the corrupt area of the device under test if a m-th bit of the test result code is different from a m-th bit of the test code. The corrupt area corresponds to an address greater than the test address by (m−1). Here, m is a positive integer less than or equal to n.

According to at least some example embodiments, a test system includes a device under test and a test device. The test device may output one of first through ($2^n$)-th input voltages to the device under test as a test signal, the first through ($2^n$)-th input voltages based on a test code having n-bits, n being an integer greater than or equal to two. The test device may further generate a test result code based on a comparison between a received test result signal and first ($2^n$)-th comparison voltages, the test result code having n-bits, and determine a corrupt area of the device under test based on the test result code. Here, n is an integer equal to or greater than two.

In at least some example embodiments, the test device may include a storage device, a data driver, a comparison circuit, an analysis circuit, and a controller. The storage device may store a test sequence. The controller may generate the test code by dividing the test sequence received from the storage device. The data driver may output one of the first through ($2^n$)-th input voltages to the device under test as the test signal based on the test code. The comparison circuit may compare the test result signal received from the device under test with each of the first through ($2^n$)-th comparison voltages, and generate first through ($2^n$)-th comparison signals based on the comparison between the test result signal and the first through ($2^n$)-th comparison signals. The analysis circuit may generate the test result code based on the first through ($2^n$)-th comparison signals. The controller may determine the corrupt area of the device under test based on each of the n-bits of the test result code generated by the analysis circuit.

In at least some example embodiments, the test device may output a first test command and the test signal to the device under test, and output a second test command to the device under test. The device under test may generate a test input code having n-bits based on a voltage level of the test signal, perform an operation corresponding to the first test command based on the test input code if the device under test receives the first test command. The device under test may generate a test output code having n-bits by performing an operation corresponding to the second test command, generate the test result signal having a voltage level corresponding to the test output code, and output the test result signal to the test device if the device under test receives the second test command.

In example embodiments, a test device comprises a data driver and a controller. The data driver may output a test signal based on a n-bit test code, the test signal being a voltage pulse having a first voltage level corresponding to the n-bit test code. The controller coupled to the data driver, the controller may generate the n-bit test code and identify a corrupt area of a device under test based on a comparison between the n-bit test code and a n-bit test result code, the n-bit test result code corresponding to a test result signal output from the device under test in response to the test signal, the test result signal being a voltage pulse having a second voltage level corresponding to the n-bit test result code, n being an integer greater than or equal to two.

According to at least some example embodiments, the test device may further include a voltage generator coupled to the data driver. The voltage generator may be configured to generate a plurality of voltages. The data driver may be configured to output one of the plurality of voltages as the test signal based on the n-bit test code.

The test device may further include an input-output circuit coupled to the controller. The input-output circuit may be configured to generate the n-bit test result code based on a comparison between the second voltage level of the test result signal and a plurality of comparison voltages, and output the n-bit test result code to the controller The input-output circuit may include: a comparison circuit configured to generate a plurality of comparison signals based on a comparison between the second voltage level of the test result signal and the plurality of comparison voltages; and an analysis circuit configured to generate the n-bit test result code based on the plurality of comparison voltages.

The analysis circuit may be configured to generate the n-bit test result code using a look-up table.

BRIEF DESCRIPTION OF THE DRAWINGS

Inventive concepts will become more apparent from the description of non-limiting example embodiments illustrated in the accompanying drawings in which like reference characters refer to like parts throughout the different views, unless otherwise specified. The drawings are not necessarily to scale, emphasis instead being placed upon illustrating the principles of inventive concepts. In the drawings.

DETAILED DESCRIPTION

Figure 1:
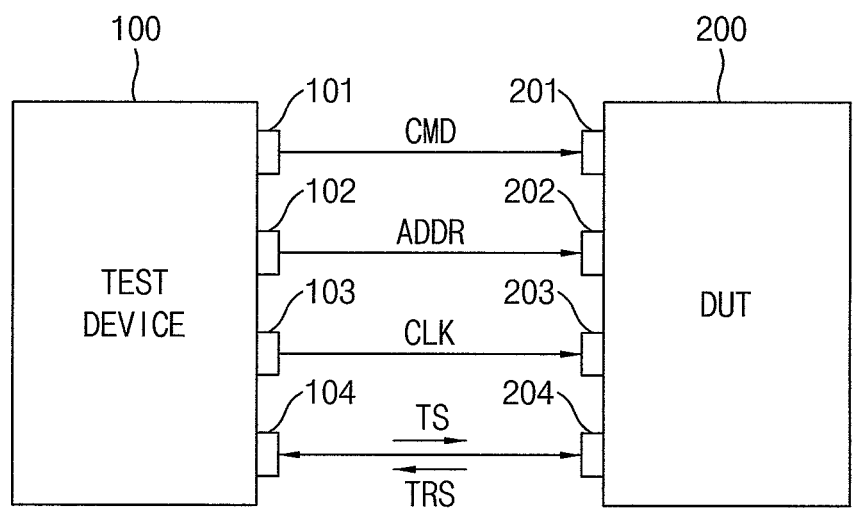
FIG. 1 is a block diagram illustrating a test system according to example embodiments of inventive concepts.

Various example embodiments will be described more fully with reference to the accompanying drawings, in which some example embodiments are shown. Example embodiments of inventive concepts may, however, be embodied in many different forms and should not be construed as limited to the embodiments set forth herein. Rather, these example embodiments are provided so that this disclosure will be thorough and complete, and will fully convey the scope of example embodiments of inventive concepts to those skilled in the art. Like reference characters and/or numerals in the drawings denote like elements throughout this application, and thus their description may not be repeated.

It will be understood that, although the terms "first", "second", etc. may be used herein to describe various elements, components, regions, and/or sections. These elements, components, regions, and/or sections should not be limited by these terms. These terms are only used to distinguish one element, component, region, and/or section from another element, component, region, and/or section. Thus, for example, a first element, component, region, and/or section could be termed a second element, component, region, and/or section; and, similarly, a second element, component, region, and/or section could be termed a first element, component, region, and/or section, without departing from the scope of example embodiments of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on" etc.).

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements, components, and/or group thereof, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

It will be apparent to those skilled in the art that various modifications and variations can be made to the non-limiting example embodiments without departing from the spirit or scope of inventive concepts described herein. Thus, it is intended that the example embodiments cover the modifications and variations of the example embodiments provided they come within the scope of the appended claims and their equivalents.

Hereinafter, example embodiments of inventive concepts will be described with reference to the accompanying drawings.

FIG. 1 is a block diagram illustrating a test system 10 according to example embodiments.

Referring to FIG. 1, a test system 10 includes a test device 100 and a device under test (DUT) 200.

A command pin 101, an address pin 102, a clock pin 103, and a data pin 104 of the test device 100 are coupled to a command pin 201, an address pin 202, a clock pin 203, and a data pin 204 of the device under test 200, respectively.

In example embodiments, the device under test 200 may be a semiconductor memory device including, but not limited to, a dynamic random access memory (DRAM) device, synchronous DRAM (SDRAM), double data rate SDRAM (DDR SDRAM), rambus DRAM (RDRAM), synchronous graphics random-access memory (SGRAM), pseudostatic RAM (PRAM), static RAM (SRAM), etc.

The test device 100 may (i) output a command signal CMD to the device under test 200 through the command pin 101 in the test device 100 and the command pin 201 in the device under test 200, (ii) output an address signal ADDR to the device under test 200 via the address pin 102 in the test device 100 and the address pin 202 in the device under test 200, and (iii) output a clock signal CLK to the device under test 200 through the clock pin 103 in the test device 100 and the clock pin 203 in the device under test 200. The test device 100 may control a test operation on the device under test 200 based on the command signal CMD, the address signal ADDR, and the clock signal CLK generated by the test device 100, and outputted to the device under test 200.

In at least one example embodiment, the test device 100 may output one of first through $(2^n)$-th input voltages to the device under test 200 through the data pin 104 in the test device 100 and the data pin 204 in the device under test 200. The one of first through $(2^n)$-th input voltages is outputted by the test device 100 as a test signal (TS) based on a test code having n-bits. Here, n represents an integer equal to or greater than two.

The device under test 200 may output a test result signal (TRS) to the test device 100 through the data pin 204 in the device under test 200 and the data pin 104 in the test device 100. The test result signal (TRS) corresponds to the test signal (TS).

The test device 100 may generate a test result code having n-bits by comparing the test result signal (TRS), which is received from the device under test 200 through the data pins 104 and 204, with each of first through $(2^n)$-th comparison voltages. After comparing the test result signal (TRS) with each of the $(2^n)$-th comparison voltages, the test device 100 may determine a bad area of the device under test 200 based on the test result code. As discussed herein, a bad area is also referred to as a corrupt area of the device under test.

In at least some example embodiments, the test device 100 may output a first test command, a test address, and the test signal (TS) to the device under test 200. When the device under test 200 receives the first test command from the test device 100, the device under test 200 may generate a test input code having n-bits based on a voltage level of the test signal (TS). The device under test 200 may further perform an operation corresponding to the first test command on an area corresponding to the test address using the test input code generated by the device under test 200.

For example, in at least some example embodiments of inventive concepts, the first test command may be a write command. When the first test command is the write command, the device under test 200 may write n-bits of the test input code to the area corresponding to the test address.

After outputting the first test command, the test device 100 may output a second test command and the test address to the device under test 200. When the device under test 200 receives the second test command from the test device 100, the device under test 200 may (i) generate a test output code having n-bits by performing an operation corresponding to the second test command on the area corresponding to the test address, (ii) generate the test result signal (TRS) based on the test output code, and (iii) provide the test result signal (TRS) to the test device 100.

For example, in at least some example embodiments of inventive concepts, the second test command may be a read command. When the second test command is the read command, the device under test 200 may (i) read data of n-bits from the area corresponding to the test address to generate the test output code, (ii) generate the test result signal (TRS) having a voltage level corresponding to the test output code, and (iii) provide the test result signal (TRS) to the test device 100.

After receiving the test result signal (TRS) from the device under test 200, the test device 100 may compare the test result signal (TRS) with each of the first through $(2^n)$-th comparison voltages to generate the test result code having n-bits. The test device 100 may further determine the bad area of the device under test 200 by comparing n-bits of the test result code to the n-bits of the test code.

According to at least some example embodiments, when n-bits of the test result code are the same as n-bits of the test code, the test device 100 may determine that the area of the device under test 200 corresponding to the test address is not a bad area.

On the other hand, when the m-th bit of the test result code is different from the m-th bit of the test code, the test device 100 may determine a part of the device under test 200, which corresponds to the m-th bit of the test code, is a bad area. That is, for example, the test device 100 may determine a part of the device under test 200, in which the m-th bit of the test code is written, is the bad area. Here, m represents a positive integer less than or equal to n.

As described above, in the test system 10 according to example embodiments, the test device 100 may provide the test signal (TS) having a voltage level corresponding to the test code having n-bits to the device under test 200. The device under test 200 may (i) generate the test input code having n-bits based on the test signal (TS), (ii) generate the test output code having n-bits after performing a test operation using the test input code, and (iii) output the test result signal (TRS) having a voltage level corresponding to the test output code to the test device 100.

Therefore, according to at least some example embodiments, in the test system 10, the test operation may be performed on the device under test 200 using data of n-bits during one data transfer period. As such, a test time for testing the device under test 200 may be decreased by 1/n times.

Although only one device under test 200 is coupled to the test device 100 in FIG. 1, example embodiments are not limited thereto. According to example embodiments, a plurality of devices under test 200 may be coupled to the test device 100. In this case, the test device 100 may perform the test operation on the plurality of devices under test 200, simultaneously, concurrently and/or consecutively.

Figure 2:
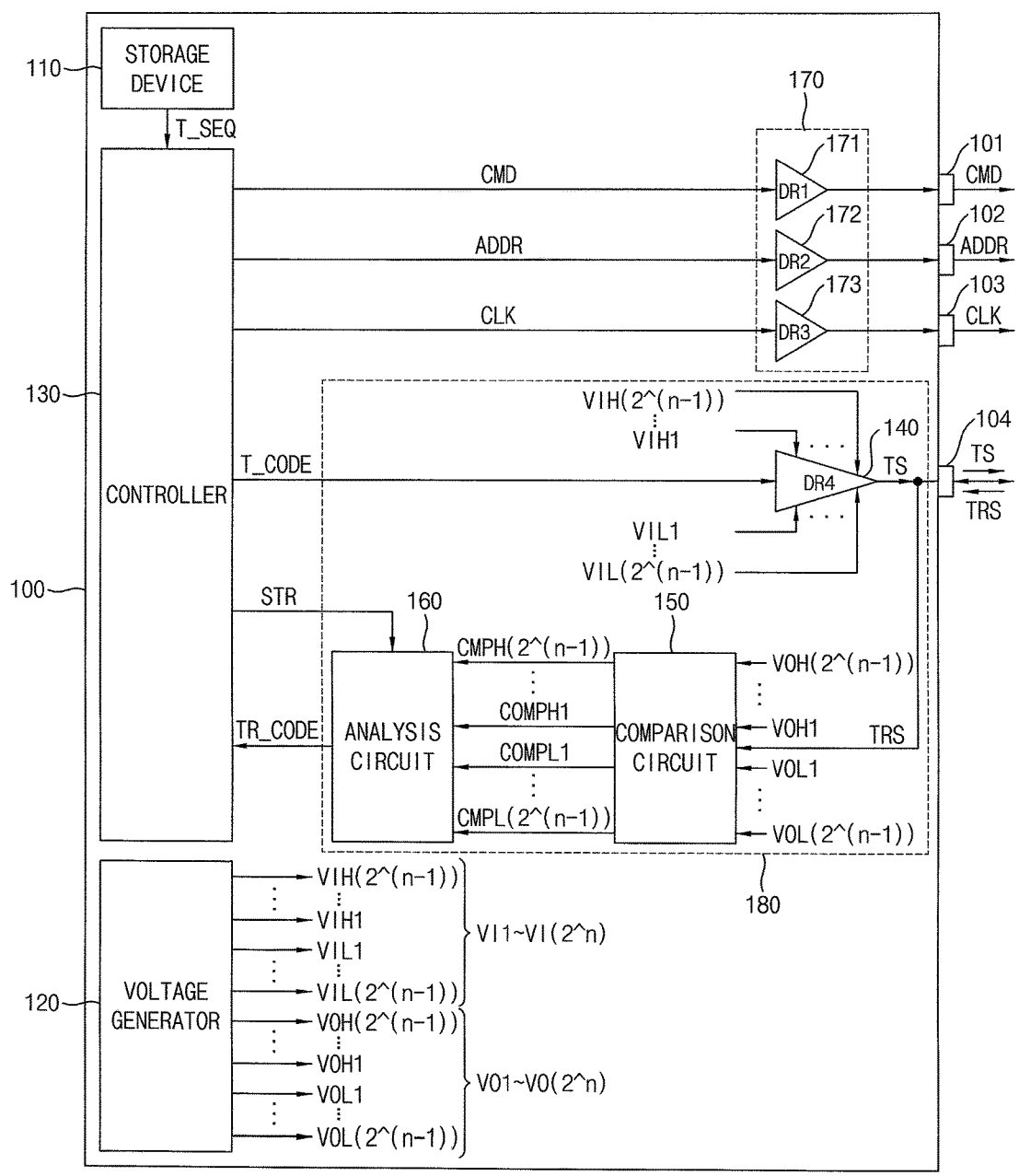
FIG. 2 is a block diagram illustrating an example embodiment of a test device included in the test system of FIG. 1.

FIG. 2 is a block diagram illustrating an example embodiment of a test device included in the test system of FIG. 1.

Referring to FIG. 2, the test device 100 may include a storage device 110, a voltage generator 120, a controller 130, a drive channel 170, and an input-output channel 180.

The controller 130 may output the command signal CMD, the address signal ADDR, and the clock signal CLK to the drive channel 170. The drive channel 170 may output the command signal CMD, the address signal ADDR, and the clock signal CLK to the device under test 200.

In at least some example embodiments, the drive channel 170 may include a command driver DR1 171, an address driver DR2 172, and a clock driver DR3 173. The command driver DR1 171 may output the command signal CMD received from the controller 130 to the device under test 200 through the command pin 101. The address driver DR2 172 may output the address signal ADDR received from the controller 130 to the device under test 200 through the address pin 102. The clock driver DR3 173 may output the clock signal CLK received from the controller 130 to the device under test 200 through the clock pin 103.

The storage device 110 may store a test sequence T_SEQ with which the test operation is performed on the device under test 200. In at least some example embodiments, the storage device 110 may include a non-volatile memory device, including but not limited to, a flash memory device.

As shown in FIG. 2, the voltage generator 120 may generate the first through $(2^n)$-th input voltages VI1~VI$(2^n)$ and the first through $(2^n)$-th comparison voltages VO1~VO$(2^n)$. The first through $(2^n)$-th input voltages VI1~VI$(2^n)$ may have different voltage levels from each other, and the first through $(2^n)$-th comparison voltages VO1~VO$(2^n)$ may have different voltage levels from each other.

In at least some example embodiments of inventive concepts, the input-output channel 180 may include a data driver DR4 140, a comparison circuit 150, and an analysis circuit 160.

Still referring to FIG. 2, the controller 130 may read the test sequence T_SEQ from the storage device 110, and generate the test code T_CODE by dividing the test sequence T_SEQ in a unit of n-bits. The controller 130 may provide the test code T_CODE to the data driver DR4 140.

The data driver DR4 140 may receive the first through $(2^n)$-th input voltages VI1~VI$(2^n)$ from the voltage generator 120. The data driver 140 may output one of the first through $(2^n)$-th input voltages VI1~VI$(2^n)$ through the data pin 104 to the device under test 200 as the test signal TS based on the test code T_CODE having n-bits. Therefore, the test signal TS may have a voltage level corresponding to the test code T_CODE.

The comparison circuit 150 may receive the test result signal TRS from the device under test 200 through the data pin 104. In addition, the comparison circuit 150 may receive the first through $(2^n)$-th comparison voltages VO1~VO$(2^n)$ from the voltage generator 120. The comparison circuit 150 may compare the test result signal TRS with each of the first through $(2^n)$-th comparison voltages VO1~VO$(2^n)$ to generate first through $(2^n)$-th comparison signals.

Still referring to FIG. 2, the analysis circuit 160 may generate the test result code TR_CODE having n-bits based on the first through $(2^n)$-th comparison signals. As a result, the test result code TR_CODE may be determined based on a voltage level of the test result signal TRS. In at least some example embodiments, the analysis circuit 160 may generate the test result code TR_CODE having n-bits. The analysis circuit 160 may generate the test result code TR_CODE based on the first through $(2^n)$-th comparison signals received from the comparison circuit 150 when a strobe signal STR provided by the controller 130 is activated.

The controller 130 may determine the bad area of the device under test 200 based on n-bits of the test result code TR_CODE provided by the analysis circuit 160.

Figure 3:
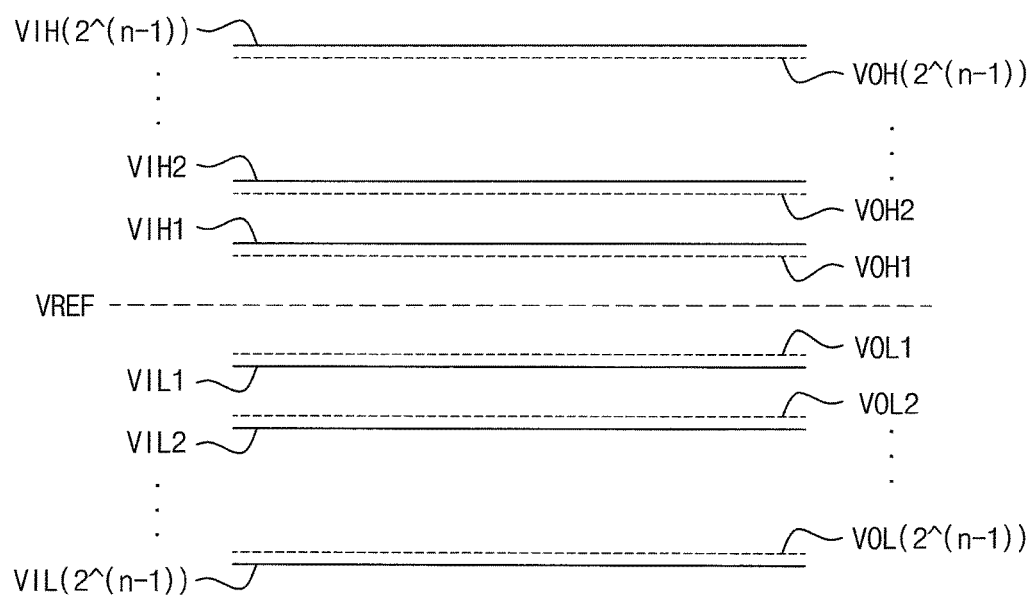
FIG. 3 is a diagram for describing first through ($2^n$)-th input voltages, and first through ($2^n$)-th comparison voltages generated by a voltage generator included in the test device of FIG. 2.

FIG. 3 is a diagram illustrating example first through $(2^n)$-th input voltages and first through $(2^n)$-th comparison voltages generated by a voltage generator included in the test device of FIG. 2.

Referring to FIGS. 2 and 3, the first through ($2^n$)-th input voltages VI1~VI($2^n$) may include first through ($2^{(n-1)}$)-th high input voltages VIH1~VIH($2^{(n-1)}$) and first through ($2^{(n-1)}$)-th low input voltages VIL1~VIL($2^{(n-1)}$). In addition, the first through ($2^n$)-th comparison voltages VO1~VO($2^n$) may include first through ($2^{(n-1)}$)-th high comparison voltages VOH1~VOH($2^{(n-1)}$) and first through ($2^{(n-1)}$)-th low comparison voltages VOL1~VOL($2^{(n-1)}$).

Referring to FIG. 3, each of the first through ($2^{(n-1)}$)-th high input voltages VIH1~VIH($2^{(n-1)}$) and each of the first through ($2^{(n-1)}$)-th high comparison voltages VOH1~VOH($2^{(n-1)}$) may be higher than a reference voltage VREF. Furthermore, each of the first through ($2^{(n-1)}$)-th low input voltages VIL1~VIL($2^{(n-1)}$) and each of the first through ($2^{(n-1)}$)-th low comparison voltages VOL1~VOL($2^{(n-1)}$) may be lower than the reference voltage VREF.

In at least some example embodiments of inventive concepts, the reference voltage VREF may correspond to a voltage level of the data pins 104 and 204 in the test device 100 and device under test 200, respectively. The test device 100 and the device under test 200 may not communicate data with each other through the data pins 104 and 204.

In at least some example embodiments of the inventive concepts, the k-th high comparison voltage VOHk may be lower than the k-th high input voltage VIHk, and the k-th low comparison voltage VOLk may be higher than the k-th low input voltage VILk. Here, k represents a positive integer less than or equal to $2^{(n-1)}$.

In addition, the first through ($2^{(n-1)}$)-th high input voltages VIH1~VIH($2^{(n-1)}$) may be different from each other by the same or substantially the same voltage difference. The first through ($2^{(n-1)}$)-th low input voltages VIL1~VIL($2^{(n-1)}$) may be different from each other by the same or substantially the same voltage difference. The first through ($2^{(n-1)}$)-th high comparison voltages VOH1~VOH($2^{(n-1)}$) may be different from each other by the same or substantially the same voltage difference. The first through ($2^{(n-1)}$)-th low comparison voltages VOL1~VOL($2^{(n-1)}$) may be different from each other by the same or substantially the same voltage difference.

Figure 4:
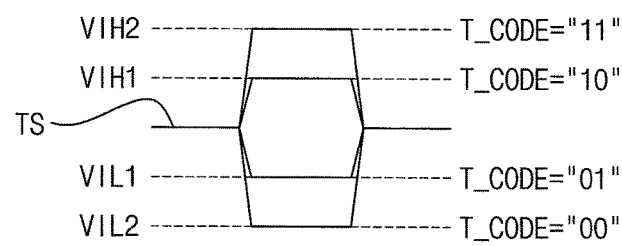
FIG. 4 is a diagram for describing example operation of a data driver included in the test device of FIG. 2.

FIG. 4 is a diagram for describing example operation of a data driver included in the test device 100 of FIG. 2.

In FIG. 4, an operation of the data driver DR4 140 is illustrated as an example in the case that the test code T_CODE includes two bits (n=2).

When the test code T_CODE includes two bits, the voltage generator 120 may provide the first high input voltage VIH1, the second high input voltage VIH2, the first low input voltage VIL1, and the second low input voltage VIL2 to the data driver DR4 140.

The data driver DR4 140 may output one of the first high input voltage VIH1, the second high input voltage VIH2, the first low input voltage VIL1, and the second low input voltage VIL2 through the data pin 104 to the device under test 200 as the test signal TS based on the test code T_CODE received from the controller 130.

For example, as illustrated in FIG. 4, the data driver DR4 140 may output the second high input voltage VIH2 as the test signal TS when the test code T_CODE is "11", output the first high input voltage VIH1 as the test signal TS when the test code T_CODE is "10", output the first low input voltage VIL as the test signal TS when the test code T_CODE is "01", and output the second low input voltage VIL2 as the test signal TS when the test code T_CODE is "00".

Therefore, the test signal TS that the device under test 200 receives from the data driver DR4 140 may have a voltage level corresponding to the test code T_CODE, which the data driver DR4 140 received from the controller 130.

The operation of the data driver DR4 140 illustrated in FIG. 4 is a non-limiting example of inventive concepts. According to example embodiments, the voltage level of the test signal TS outputted by the data driver DR4 140 based on the test code T_CODE received from the controller 130 may be defined differently from that illustrated in FIG. 4.

Figure 5:
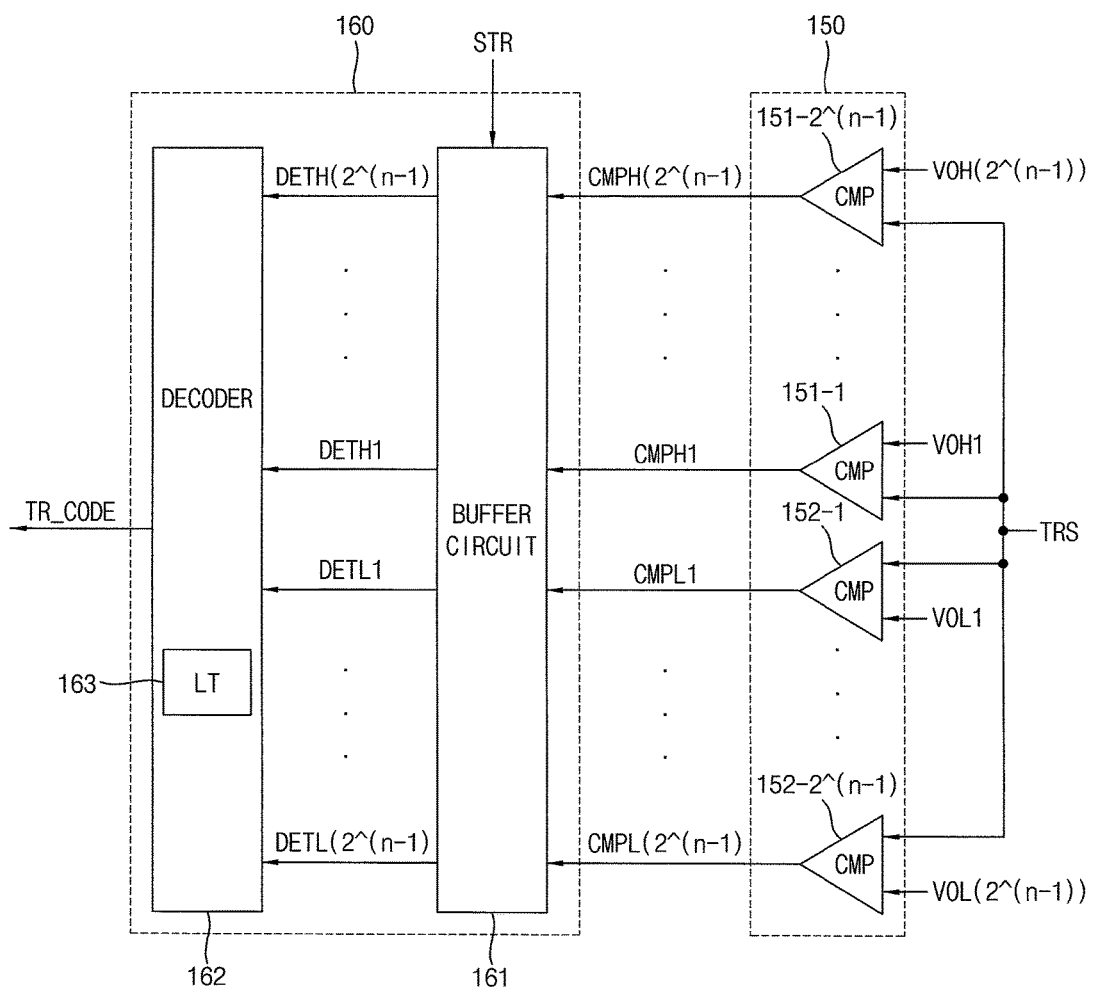
FIG. 5 is a block diagram illustrating an example embodiment of a comparison circuit and an analysis circuit included in the test device of FIG. 2.

FIG. 5 is a block diagram illustrating a non-limiting example of a comparison circuit 150 and an analysis circuit 160 included in the test device 100, as shown in FIG. 2.

Referring to FIG. 5, the comparison circuit 150 may include first through ($2^{(n-1)}$)-th high comparators CMP 151-1~151-$2^{(n-1)}$ and first through ($2^{(n-1)}$)-th low comparators CMP 152-1~152-$2^{(n-1)}$.

The first through ($2^{(n-1)}$)-th high comparators CMP 151-1~151-$2^{(n-1)}$ may receive the first through ($2^{(n-1)}$)-th high comparison voltages VOH1~VOH($2^{(n-1)}$); and the first through ($2^{(n-1)}$)-th low comparators CMP 152-1~152-$2^{(n-1)}$ may receive the first through ($2^{(n-1)}$)-th low comparison voltages VOL1~VOL($2^{(n-1)}$). In addition, as shown in FIG. 5, the test result signal TRS received from the device under test 200 by the data driver DR4 140 may be received by the first through ($2^{(n-1)}$)-th high comparators CMP 151-1~151-$2^{(n-1)}$ and the first through ($2^{(n-1)}$)-th low comparators CMP 152-1~152-$2^{(n-1)}$.

In at least this example embodiment of inventive concepts, the k-th high comparator CMP 151-$k$ may output a k-th high comparison signal CMPHk having a first logic level when the test result signal TRS is greater than or equal to the k-th high comparison voltage VOHk. The k-th high comparator CMP 151-$k$ may also output the k-th high comparison signal CMPHk having a second logic level when the test result signal TRS is less than the k-th high comparison voltage VOHk.

In at least this example embodiment of inventive concepts, the k-th low comparator CMP 152-$k$ may output a k-th low comparison signal CMPLk having the first logic level when the test result signal TRS is less than or equal to the k-th low comparison voltage VOLk. The k-th low comparator 152-$k$ may also output the k-th low comparison signal CMPLk having the second logic level when the test result signal TRS is greater than the k-th low comparison voltage VOLk.

In at least some example embodiments of inventive concepts, the first logic level may be a logic high level, and the second logic level may be a logic low level.

The comparison circuit 150 may output (i) the first through ($2^{(n-1)}$)-th high comparison signals CMPH1~CMPH($2^{(n-1)}$), and (ii) the first through ($2^{(n-1)}$)-th low comparison signals CMPL1~CMPL($2^{(n-1)}$), to the analysis circuit 160 as the first through ($2^n$)-th comparison signals. The first through ($2^{(n-1)}$)-th high comparison signals CMPH1~CMPH($2^{(n-1)}$) are generated by the first through ($2^{(n-1)}$)-th high comparators CMP 151-1~151-$2^{(n-1)}$. The first through ($2^{(n-1)}$)-th low comparison signals CMPL1~CMPL($2^{(n-1)}$) are generated by the first through ($2^{(n-1)}$)-th low comparators CMP 152-1~152-$2^{(n-1)}$.

In at least some example embodiments of inventive concepts, the analysis circuit 160 may include a buffer circuit 161 and a decoder 162.

The buffer circuit 161 may output (i) first through (2^(n−1))-th high determination signals DETH1~DETH(2^(n−1)), and (ii) first through (2^(n−1))-th low determination signals DETL1~DETL(2^(n−1)).

The first through (2^(n−1))-th high determination signals DETH1~DETH(2^(n−1)) are outputted by the buffer circuit 161 based on (i) the buffer circuit 161 receiving the first through (2^(n−1))-th high comparison signals CMPH1~CMPH(2^(n−1)) from the comparison circuit 150, and (ii) the activated strobe signal STR outputted by the controller 130 to the buffer circuit 161.

Similarly, still referring to FIG. 5, the first through (2^(n−1))-th low determination signals DETL1~DETL(2^(n−1)) are outputted by the buffer circuit 161 based on (i) the buffer circuit 161 receiving the first through (2^(n−1))-th low comparison signals CMPL1~CMPL(2^(n−1)) from the comparison circuit 150, and (ii) the activated strobe signal STR outputted by the controller 130 to the buffer circuit 161.

In at least this example embodiment of inventive concepts, the buffer circuit 161 may generate the first through (2^(n−1))-th high determination signals DETH1~DETH(2^(n−1)) by sampling the first through (2^(n−1))-th high comparison signals CMPH1~CMPH(2^(n−1)) in response to the strobe signal STR outputted by the controller 130 to the buffer circuit 161. Likewise, the buffer circuit 161 may generate the first through (2^(n−1))-th low determination signals DETL1~DETL(2^(n−1)) by sampling the first through (2^(n−1))-th low comparison signals CMPL1~CMPL(2^(n−1)) in response to the strobe signal STR outputted by the controller 130 to the buffer circuit 161.

Still referring to FIG. 5, the decoder 162 may generate the test result code TR_CODE corresponding to a voltage level of the test result signal TRS based on a logic level of each of the first through (2^(n−1))-th high determination signals DETH1~DETH(2^(n−1)), and the first through (2^(n−1))-th low determination signals DETL1~DETL(2^(n−1)).

In at least some example embodiments of inventive concepts, the decoder 162 may include a lookup table (LT) 163. The lookup table 163 stores logic levels of the first through (2^(n−1))-th high determination signals DETH1~DETH(2^(n−1)), and the first through (2^(n−1))-th low determination signals DETL1~DETL(2^(n−1)) in association with a value of the test result code TR_CODE. The decoder 162 may read the test result code TR_CODE corresponding to logic levels of the first through (2^(n−1))-th high determination signals DETH1~DETH(2^(n−1)), and the first through (2^(n−1))-th low determination signals DETL1~DETL(2^(n−1)) from the lookup table 163. Based on the reading operation performed by the decoder 162, the decoder 162 may output the read test result code TR_CODE.

Figures 6, 7:
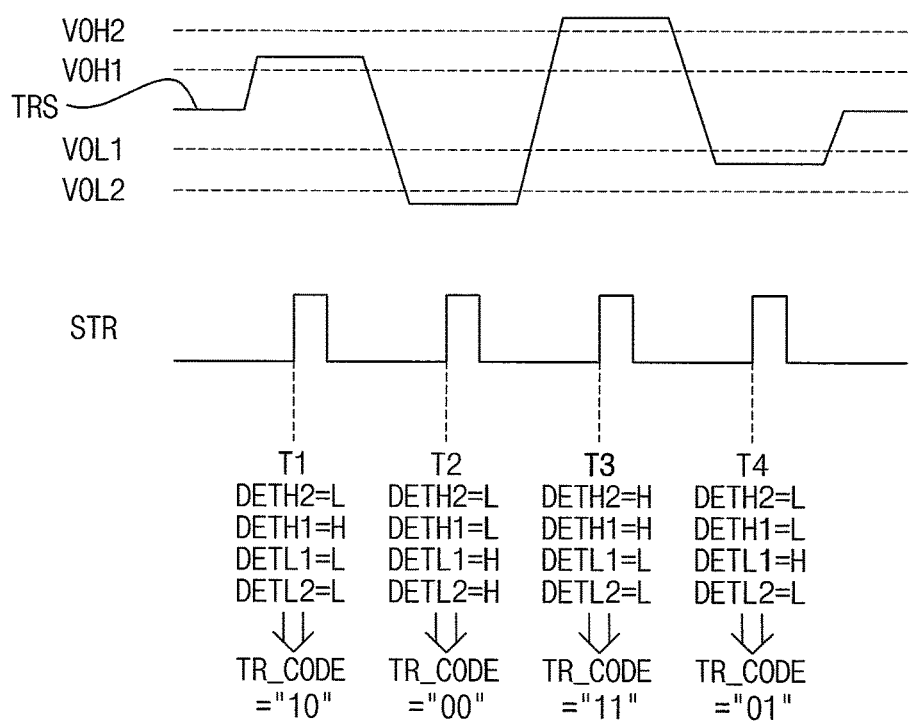
FIG. 6 is a diagram illustrating an example of a lookup table included in a decoder of FIG. 5.
FIG. 7 is a diagram illustrating example operation of the comparison circuit and the analysis circuit of FIG. 5.

FIG. 6 illustrates a non-limiting example embodiment of the lookup table 163 that maybe included in the decoder 162, of FIG. 5.

In FIG. 6, the lookup table 163 illustrates the case when the test code T_CODE includes two bits (n=2).

As illustrated in FIG. 6, the lookup table 163 may define a value of the test result code TR_CODE according to logic levels of the first high determination signal DETH1, the second high determination signal DETH2, the first low determination signal DETL1, and the second low determination signal DETL2.

For example, the lookup table 163 may define the value of the test result code TR_CODE as "11" when the second low determination signal DETL2 is at the logic low level, the first low determination signal DETL1 is at the logic low level, the first high determination signal DETH1 is at the logic high level, and the second high determination signal DETH2 is at the logic high level.

As shown in FIG. 6, the lookup table 163 may, for example, define the value of the test result code TR_CODE as "10" when the second low determination signal DETL2 is at the logic low level, the first low determination signal DETL1 is at the logic low level, the first high determination signal DETH1 is at the logic high level, and the second high determination signal DETH2 is at the logic low level.

Also shown in FIG. 6, the lookup table 163 may, for example, define the value of the test result code TR_CODE as "01" when the second low determination signal DETL2 is at the logic low level, the first low determination signal DETL1 is at the logic high level, the first high determination signal DETH1 is at the logic low level, and the second high determination signal DETH2 is at the logic low level.

Also shown in FIG. 6, the lookup table 163 may, for example, define the value of the test result code TR_CODE as "00" when the second low determination signal DETL2 is at the logic high level, the first low determination signal DETL1 is at the logic high level, the first high determination signal DETH1 is at the logic low level, and the second high determination signal DETH2 is at the logic low level.

FIG. 7 is a diagram for describing example operation of the comparison circuit 150 and the analysis circuit 160 of FIG. 5.

In FIG. 7, an operation of the comparison circuit 150 and the analysis circuit 160 is illustrated as an example in the case that the test code T_CODE includes two bits (n=2).

Hereinafter, the operation of the comparison circuit 150 and the analysis circuit 160 will be described with reference to FIGS. 5, 6 and 7.

In reference to FIG. 7, at a first time T1 when the strobe signal STR is activated, the test result signal TRS may be higher than the first high comparison voltage VOH1 and lower than the second high comparison voltage VOH2. As a result, (i) the second high comparator CMP 151-2 may output, the second high comparison signal CMPH2 having the logic low level to the buffer circuit 161, (ii) the first high comparator CMP 151-1 may output the first high comparison signal CMPH1 having the logic high level to the buffer circuit 161, (iii) the first low comparator CMP 152-1 may output the first low comparison signal CMPL1 having the logic low level to the buffer circuit 161, and (iv) the second low comparator CMP 152-2 may output the second low comparison signal CMPL2 having the logic low level to the buffer circuit 161. Based on the receipt of the foregoing signals from the respective comparator, the buffer circuit 161 may generate the following: (i) the second high determination signal DETH2 having the logic low level, (ii) the first high determination signal DETH1 having the logic high level, (iii) the first low determination signal DETL1 having the logic low level, and (iv) the second low determination signal DETL2 having the logic low level. The foregoing signals generated by the buffer circuit 161 may be outputted to the decoder 162. Upon receiving the foregoing signals from the buffer circuit 161, the decoder 162 may generate the test result code TR_CODE having a value of "10", as shown in the lookup table 163 of FIG. 6.

Still referring to FIG. 7, at a second time T2 when the strobe signal STR is activated, the test result signal TRS may be lower than the second low comparison voltage VOL2. As a result, (i) the second high comparator CMP 151-2 may output the second high comparison signal CMPH2 having the logic low level to the buffer circuit 161, (ii) the first high comparator CMP 151-1 may output the first high comparison signal CMPH1 having the logic low level to the buffer circuit 161, (iii) the first low comparator CMP 152-1 may output the first low comparison signal CMPL1 having the logic high level to the buffer circuit 161, and (iv) the second low comparator CMP 152-2 may output the second low comparison signal CMPL2 having the logic high level to the buffer circuit 161. Based on the receipt of the foregoing signals from the respective comparator, the buffer circuit 161 may generate the following: (i) the second high determination signal DETH2 having the logic low level, (ii) the first high determination signal DETH1 having the logic low level, (iii) the first low determination signal DETL1 having the logic high level, and (iv) the second low determination signal DETL2 having the logic high level. The foregoing signals generated by the buffer circuit 161 may be outputted to the decoder 162. Upon receiving the foregoing signals from the buffer circuit 161, the decoder 162 may generate the test result code TR_CODE having a value of "00", as shown in the lookup table 163 of FIG. 6.

Still referring to FIG. 7, at a third time T3 when the strobe signal STR is activated, the test result signal TRS may be higher than the second high comparison voltage VOH2. As a result, (i) the second high comparator CMP 151-2 may output the second high comparison signal CMPH2 having the logic high level to the buffer circuit 161, (ii) the first high comparator CMP 151-1 may output the first high comparison signal CMPH1 having the logic high level to the buffer circuit 161, (iii) the first low comparator 152-1 may output the first low comparison signal CMPL1 having the logic low level to the buffer circuit 161, and (iv) the second low comparator 152-2 may output the second low comparison signal CMPL2 having the logic low level to the buffer circuit 161. Based on the receipt of the foregoing signals from the respective comparator, the buffer circuit 161 may generate the following: (i) the second high determination signal DETH2 having the logic high level, (ii) the first high determination signal DETH1 having the logic high level, (iii) the first low determination signal DETL1 having the logic low level, and (iv) the second low determination signal DETL2 having the logic low level. Upon receiving the foregoing signals from the buffer circuit 161, the decoder 162 may generate the test result code TR_CODE having a value of "11", as shown in the lookup table 163 of FIG. 6.

Still referring to FIG. 7, at a fourth time T4 when the strobe signal STR is activated, the test result signal TRS may be lower than the first low comparison voltage VOL1 and higher than the second low comparison voltage VOL2. As a result, (i) the second high comparator CMP 151-2 may output the second high comparison signal CMPH2 having the logic low level to the buffer circuit 161, (ii) the first high comparator CMP 151-1 may output the first high comparison signal CMPH1 having the logic low level to the buffer circuit 161, (iii) the first low comparator CMP 152-1 may output the first low comparison signal CMPL1 having the logic high level to the buffer circuit 161, and (iv) the second low comparator CMP 152-2 may output the second low comparison signal CMPL2 having the logic low level to the buffer circuit 161. Based on the receipt of the foregoing signals from the respective comparator, the buffer circuit 161 may generate the following: (i) the second high determination signal DETH2 having the logic low level, (ii) the first high determination signal DETH1 having the logic low level, (iii) the first low determination signal DETL1 having the logic high level, and (iv) the second low determination signal DETL2 having the logic low level. Upon receiving the foregoing signals from the buffer circuit 161, the decoder 162 may generate the test result code TR_CODE having a value of "01", as shown in the lookup table 163 of FIG. 6.

The operation of the comparison circuit 150 and the analysis circuit 160 described above with reference to FIGS. 5, 6, and 7 may be the same or substantially the same in the case where n is greater than two.

Referring back to FIG. 2, the controller 130 may determine the bad area of the device under test 200 by comparing n-bits of the test result code TR_CODE received from the decoder 162 with n-bits of the test code T_CODE generated by the controller 130.

Hereinafter, example operation of the test system 10 will be described with reference to FIGS. 1 to 7.

As shown in FIGS. 1 and 2, the controller 130 may output the clock signal CLK to the clock driver DR3 173, and the clock driver DR3 173 may output the clock signal CLK to the device under test 200 through the clock pins 103 and 203, provided in the test device 100 and the device under test 200, respectively. Therefore, the device under test 200 may operate in synchronization with the clock signal CLK.

The controller 130 may output a write command CMD to the command driver DR1 171, and output a test address ADDR to the address driver DR2 172. The command driver DR1 171 may output the write command CMD to the device under test 200 through the command pins 101 and 201, provided in the test device 100 and the device under test 200, respectively. The address driver DR2 172 may output the test address ADDR to the device under test 200 through the address pins 102 and 202, provided in the test device 100 and the device under test 200, respectively.

Still in reference to FIG. 2, the controller 130 may read the test sequence T_SEQ from the storage device 110, generate the test code T_CODE by dividing the test sequence T_SEQ in units of n-bits, and provide the test code T_CODE to the data driver DR4 140. The data driver DR4 140 may output one of the first through $(2^{(n-1)})$-th high input voltages VIH1~VIH$(2^{(n-1)})$ and the first through $(2^{(n-1)})$-th low input voltages VIL1~VIL$(2^{(n-1)})$ through the data pins 104 and 204, provided in the test device 100 and the device under test 200, respectively, to the device under test 200 as the test signal TS based on the test code T_CODE.

When the device under test 200 receives the write command CMD from the test device 100, the device under test 200 may generate the test input code having n-bits based on a voltage level of the test signal TS. In at least some example embodiments of inventive concepts, the device under test 200 may generate the test input code corresponding to the test signal TS using the first through $(2^{(n-1)})$-th high comparison voltages VOH1~VOH$(2^{(n-1)})$ and the first through $(2^{(n-1)})$-th low comparison voltages VOL1~VOL$(2^{(n-1)})$. In at least some non-limiting example embodiments of inventive concepts, the first through $(2^{(n-1)})$-th high comparison voltages VOH1~VOH$(2^{(n-1)})$ and the first through $(2^{(n-1)})$-th low comparison voltages VOL1~VOL$(2^{(n-1)})$ may be outputted by the test device 100 to the device under test 200. In some other non-limiting example embodiments of inventive concepts, the first through $(2^{(n-1)})$-th high comparison voltages VOH1~VOH$(2^{(n-1)})$ and the first through $(2^{(n-1)})$-th low comparison voltages VOL1~VOL$(2^{(n-1)})$ may be internally generated by the device under test 200. Therefore, the test input code may be the same as the test code T_CODE.

The device under test 200 may write n-bits of the test input code in an area corresponding to the test address. For example, the device under test 200 may write each of n-bits of the test input code in areas corresponding to addresses that consecutively increase from the test address.

Furthermore, the controller 130 may output a read command CMD to the command driver DR1 171, and output the test address ADDR to the address driver DR2 172. The command driver DR1 171 may output the read command CMD to the device under test 200 through the command pins 101 and 201, provided in the test device 100 and the device under test 200, respectively. The address driver DR2 172 may output the test address to the device under test 200 through the address pins 102 and 202, provided in the test device 100 and the device under test 200, respectively.

When the device under test 200 receives the read command CMD from the test device 100, the device under test 200 may read data of n-bits from the area corresponding to the test address to generate the test output code, and generate the test result signal TRS having a voltage level corresponding to the test output code.

In at least some example embodiments of inventive concepts, the device under test 200 may generate the test result signal TRS corresponding to the test output code using the first through $(2^{(n-1)})$-th high input voltages VIH1~VIH $(2^{(n-1)})$ and the first through $(2^{(n-1)})$-th low input voltages VIL1~VIL$(2^{(n-1)})$.

In at least some example embodiments of inventive concepts, the device under test 200 may receive the first through $(2^{(n-1)})$-th high input voltages VIH1~VIH$(2^{(n-1)})$ and the first through $(2^{(n-1)})$-th low input voltages VIL1~VIL$(2^{(n-1)})$ from the test device 100.

In at least some example embodiments of inventive concepts, the first through $(2^{(n-1)})$-th high input voltages VIH1~VIH$(2^{(n-1)})$ and the first through $(2^{(n-1)})$-th low input voltages VIL1~VIL$(2^{(n-1)})$ may be internally generated by the device under test 200. The device under test 200 may provide the test result signal TRS to the test device 100 through the data pins 104 and 204, provided in the test device 100 and the device under test 200, respectively.

The comparison circuit 150, as shown in FIG. 5, which is implemented in the test device 100, may compare the test result signal TRS with each of the first through $(2^{(n-1)})$-th high comparison voltages VOH1~VOH$(2^{(n-1)})$ and each of the first through $(2^{(n-1)})$-th low comparison voltages VOL1~VOL$(2^{(n-1)})$. Based on this comparison, the comparison circuit 150 may generate the first through $(2^{(n-1)})$-th high comparison signals CMPH1~CMPH$(2^{(n-1)})$ and the first through $(2^{(n-1)})$-th low comparison signals CMPL1~CMPL$(2^{(n-1)})$.

The analysis circuit 160, as shown in FIG. 5, which is implemented in the test device 100, may generate the test result code TR_CODE based on logic levels of the first through $(2^{(n-1)})$-th high comparison signals CMPH1~CMPH$(2^{(n-1)})$ and the first through $(2^{(n-1)})$-th low comparison signals CMPL1~CMPL$(2^{(n-1)})$.

The controller 130 may determine the bad area of the device under test 200 by comparing n-bits of the test result code TR_CODE with n-bits of the test code T_CODE, respectively. For example, when n-bits of the test result code TR_CODE are the same as n-bits of the test code T_CODE, the controller 130 may determine that a part of the device under test 200, which corresponds to the test address, is a good area.

On the other hand, when m-th bit of the test result code TR_CODE is different from m-th bit of the test code T_CODE, the controller 130 may determine that a part of the device under test 200, which corresponds to an address greater than the test address by (m−1), as the bad area.

The controller 130, as shown in FIG. 2, maybe implemented using hardware components, a processor executing software components, or a combination thereof. Upon execution of one or more algorithms, described in example embodiments of inventive concepts, the aforementioned hardware components, or processor executing software components, result in a special purpose processor. Algorithms, as presented in example embodiments of inventive concepts, constitute sufficient structure, that may include mathematical formulas, flow charts, computer code, and/or necessary steps, which upon execution result in a special purpose computer that is programmed to perform the algorithms disclosed in connection with example embodiments of inventive concepts.

The one or more aforementioned processor(s) are computer processing devices configured to carry out the program code by performing arithmetical, logical, and input/output operations. Once a program code is loaded into the one or more processors, the one or more processors may be programmed to perform the program code, thereby transforming the one or more processors into special purpose processor(s). Alternatively, or in addition to the processors discussed above, the hardware devices may include one or more Central Processing Units (CPUs), digital signal processors (DSPs), application-specific-integrated-circuits (ASICs), system on chips (SoCs), field programmable gate arrays (FPGAs), or the like. In at least some cases, the one or more CPUs, SoCs, DSPs, ASICs and FPGAs may generally be referred to as processing circuits, processing circuitry and/or microprocessors.

As described above with reference to FIGS. 1 to 7, the test device 100 may provide the test signal TS having a voltage level corresponding to the test code T_CODE having n-bits to the device under test 200. The device under test 200 may generate the test input code having n-bits based on the received test signal TS from the test device 100. The device under test 200 may generate the test output code having n-bits after performing a test operation using the test input code, and provide the test result signal TRS having a voltage level corresponding to the test output code to the test device 100.

Therefore, in test systems according to at least some example embodiments, the test operation may be performed on the device under test using data of n-bits during one data transfer period. As a result, at least some example embodiments of inventive concepts may decrease testing time for testing the device under test by about 1/n times.

Figure 8:
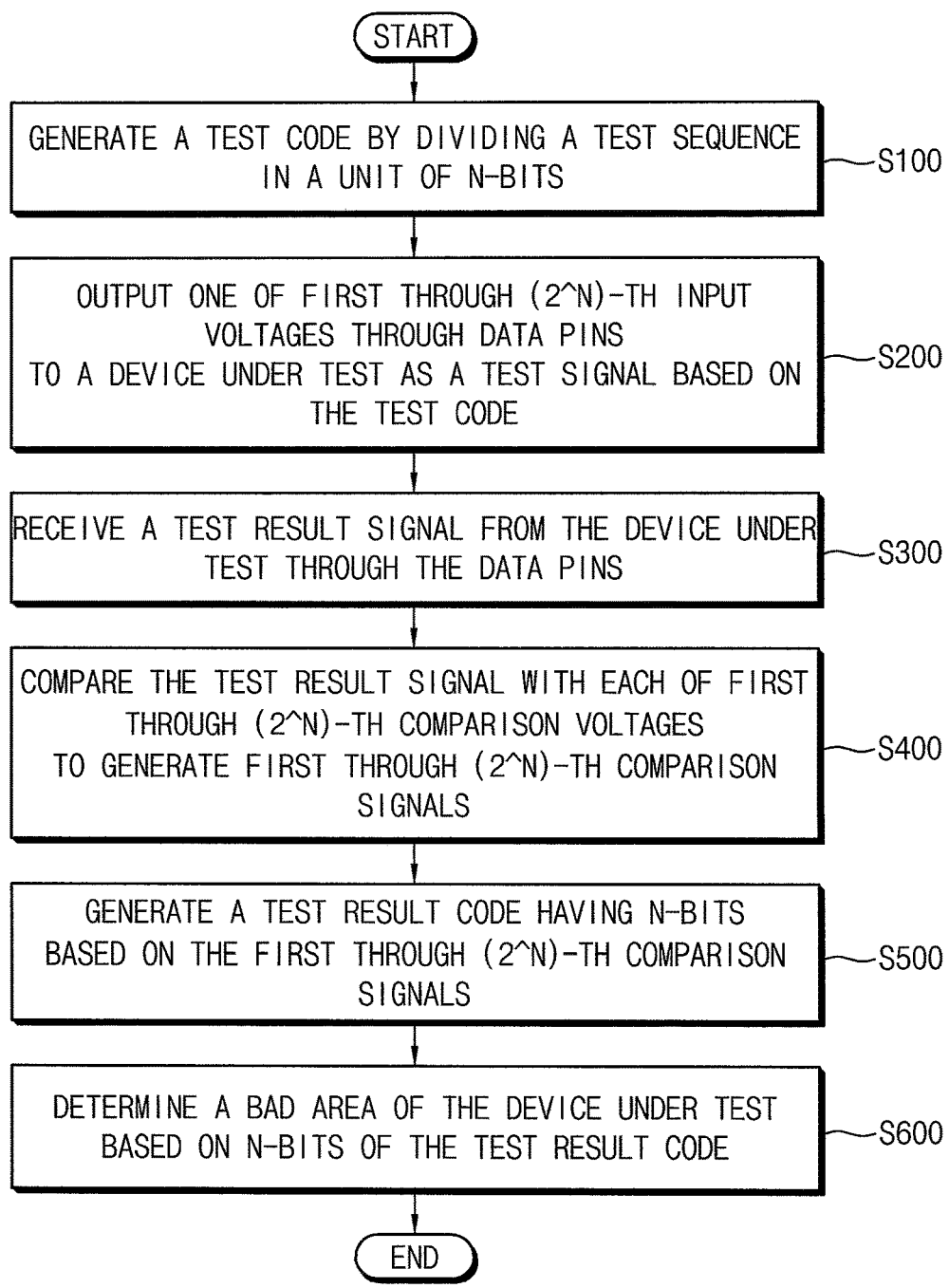
FIG. 8 is a flow chart illustrating a method of operating a test device according to example embodiments.

FIG. 8 is a flow chart illustrating a method of operating a test device according to example embodiments.

The method of operating a test device of FIG. 8 may be performed by the test device 100 included in the test system 10 of FIG. 1. However, example embodiments are not limited to this example.

Hereinafter, a method of operating the test device 100 will be described with reference to FIGS. 1 to 8.

Referring to FIG. 8, at S100 the test device 100 may generate the test code T_CODE by dividing the test sequence T_SEQ into units of n-bits.

At S200, the test device 100 may output one of the first through $(2^n)$-th input voltages VI1~VI$(2^n)$ through the data pins 104 and 204 to the device under test 200 as the test signal TS based on the test code T_CODE. In at least some example embodiments, the device under test 200 may be any kind of semiconductor device capable of performing a write operation and/or a read operation.

At S300, the device under test 200 may generate the test result signal TRS corresponding to the test signal TS, and the test device 100 may receive the test result signal TRS from the device under test 200 through the data pins 104 and 204.

At S400, the test device 100 may compare the test result signal TRS with each of the first through ($2^n$)-th comparison voltages VO1~VO($2^n$) to generate the first through ($2^n$)-th comparison signals.

At S500, the test device 100 may generate the test result code TR_CODE having n-bits based on the first through ($2^n$)-th comparison signals.

At S600, the test device 100 may determine the bad area of the device under test 200 based on n-bits of the test result code TR_CODE.

In at least some example embodiments of inventive concepts, the first through ($2^n$)-th input voltages VI1~VI($2^n$) may include the first through ($2^{(n-1)}$)-th high input voltages VIH1~VIH($2^{(n-1)}$) and the first through ($2^{(n-1)}$)-th low input voltages VIL1~VIL($2^{(n-1)}$), and the first through ($2^n$)-th comparison voltages VO1~VO($2^n$) may include the first through ($2^{(n-1)}$)-th high comparison voltages VOH1~VOH($2^{(n-1)}$) and the first through ($2^{(n-1)}$)-th low comparison voltages VOL1~VOL($2^{(n-1)}$).

Figure 9:
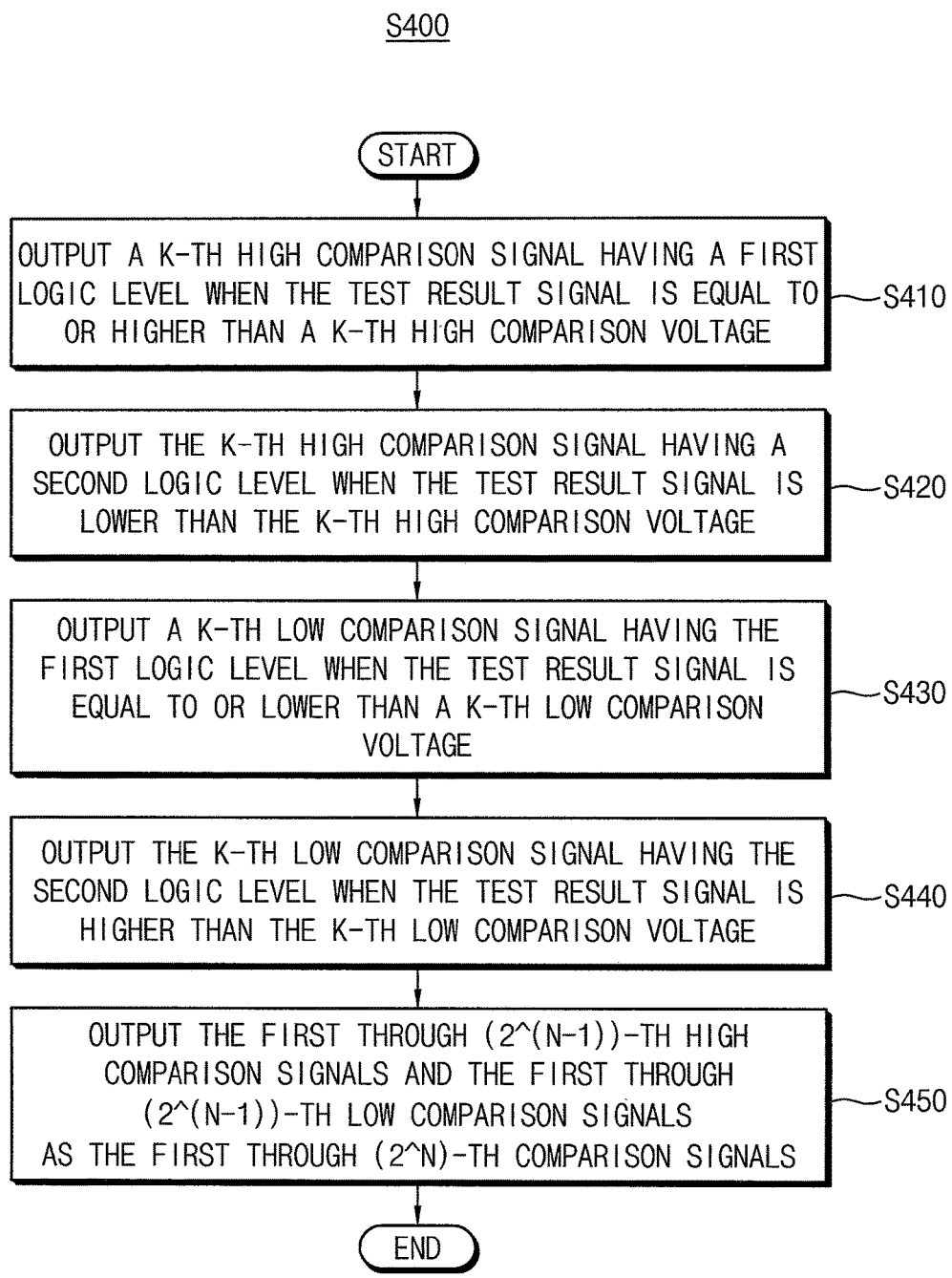
FIG. 9 is a flow chart illustrating an example embodiment of a process of generating first through ($2^n$)-th comparison signals of FIG. 8.

FIG. 9 is a flow chart illustrating an example embodiment of a method of generating first through ($2^n$)-th comparison signals discussed above with regard to FIG. 8.

Referring to FIG. 9, at S410, the test drive 100 may output the k-th high comparison signal CMPHk having the first logic level when the test result signal TRS is greater than or equal to the k-th high comparison voltage VOHk.

At S420, the test device 100 may output the k-th high comparison signal CMPHk having the second logic level when the test result signal TRS is less than the k-th high comparison voltage VOHk.

At S430, the test device 100 may output the k-th low comparison signal CMPLk having the first logic level when the test result signal TRS is less than or equal to the k-th low comparison voltage VOLk.

At S440, the test device 100 may output the k-th low comparison signal CMPLk having the second logic level when the test result signal TRS is greater than the k-th low comparison voltage VOLk.

At S450, the test device 100 may output the first through ($2^{(n-1)}$)-th high comparison signals CMPH1~CMPH($2^{(n-1)}$) and the first through ($2^{(n-1)}$)-th low comparison signals CMPL1~CMPL($2^{(n-1)}$) as the first through ($2^n$)-th comparison signals.

Figure 10:
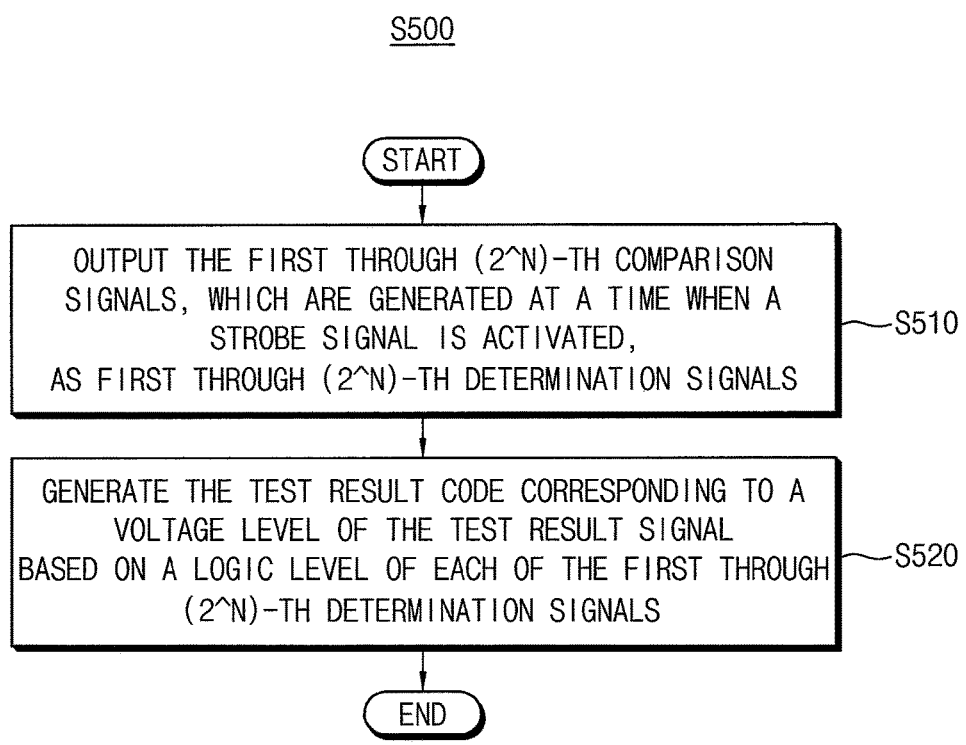
FIG. 10 is a flow chart illustrating an example embodiment of a process of generating a test result code of FIG. 8.

FIG. 10 is a flow chart illustrating an example embodiment of a method of generating a test result code discussed above with regard to FIG. 8.

Referring to FIG. 10, at S510, the test device 100 may output the first through ($2^n$)-th comparison signals as the first through ($2^n$)-th determination signals. The first through ($2^n$)-th comparison signals are generated at a time when the strobe signal STR is activated.

At S520, the test device 100 may generate the test result code TR_CODE corresponding to a voltage level of the test result signal TRS based on a logic level of each of the first through ($2^n$)-th determination signals.

A structure and an operation of the test device 100 are described above with reference to FIGS. 1 to 7. Therefore, a more detailed description of the steps of FIGS. 8 to 10 will be omitted.

Figure 11:
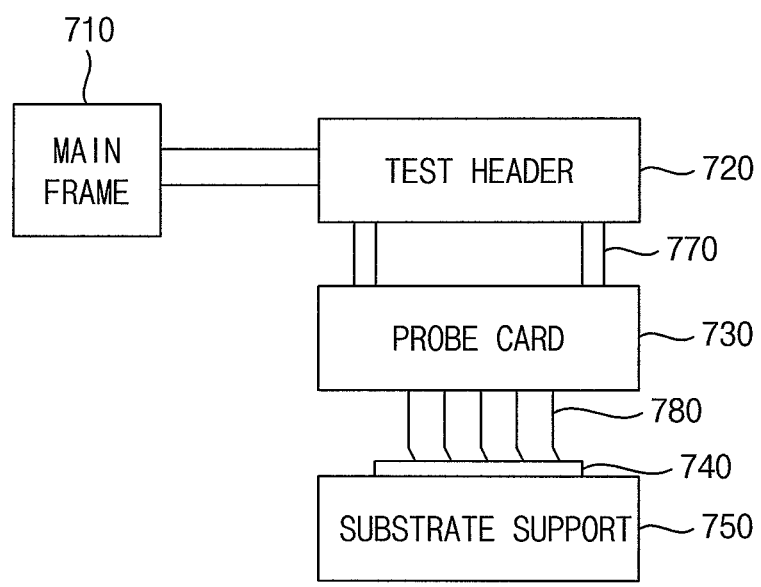
FIG. 11 is a block diagram illustrating a test system according to example embodiments.

FIG. 11 is a block diagram illustrating a test system according to example embodiments.

Referring to FIG. 11, a test system 700 may include a test main frame 710, a test header 720, a probe card 730, a wafer 740, and a substrate support 750. The wafer 740 may include a plurality of semiconductor devices that are to be tested.

The test main frame 710 may generate a test signal, and receive test result signals generated by the semiconductor devices formed in or on the wafer 740.

In at least some example embodiments of inventive concepts, the test header 720 may move up and down such that the probe card 730 may be relatively easily attached to the test header 720, and the wafer 740 may be relatively easily mounted on the substrate support 750. In other example embodiments of inventive concepts, the substrate support 750 may move up and down while the test header 720 is fixed. In still other example embodiments of inventive concepts, both of the test header 720 and the substrate support 750 may move up and down. The test main frame 710, the test header 720, and the substrate support 750 may constitute an automatic test equipment (ATE).

The probe card 730 may include a connector 770 and probe needles 780. The connector 770 may connect the test header 720 to the probe card 730, and the probe needles 780 may connect the probe card 730 to pads of the semiconductor devices formed in the wafer 740. The probe card 730 may transmit the test signal to the probe needles 780, which is received through the connector 770. In addition, the probe card 730 may transmit the test result signals to the connector 770, which are received through the probe needles 780.

The test main frame 710 may be implemented with the test device 100 included in the test system 10 of FIG. 1, and each of the semiconductor devices formed in the wafer 740 may be implemented with the device under test 200 included in the test system 10 of FIG. 1. Therefore, as described above with reference to FIGS. 1 to 10, a test time for testing the semiconductor devices formed in the wafer 740 of the test system 700 may be decreased (e.g., effectively decreased).

The foregoing is illustrative of inventive concepts and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of inventive concepts as defined in the claims.

It is to be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:
1. A test device, comprising:
 a storage device configured to store a test sequence;
 a controller configured to generate a test code having n-bits based on the stored test sequence, n being an integer greater than or equal to two;
 a data driver configured to output one of first through ($2^n$)-th input voltages to a device under test as a test signal, the first through ($2^n$)-th input voltages based on the test code generated by the controller;
 a comparison circuit configured to generate first through ($2^n$)-th comparison signals based on a comparison between a received test result signal and each of first through ($2^n$)-th comparison voltages; and an analysis circuit configured to generate a test result code having n-bits based on the first through ($2^n$)-th comparison signals generated by the comparison circuit, wherein the controller is further configured to determine a corrupt area of the device under test based on the n-bits of the test result code, wherein the first through ($2^n$)-th input voltages include first through ($2^{(n-1)}$)-th high input voltages and first through ($2^{(n-1)}$)-th low input voltages, wherein the first through ($2^n$)-th comparison voltages include first through ($2^{(n-1)}$)-th high comparison voltages and first through ($2^{(n-1)}$)-th low comparison voltages, wherein a k-th of the first through ($2^n$)-th high comparison voltages is lower than a k-th of the first through ($2^{(n-1)}$)-th high input voltages, wherein a k-th of the of the first through ($2^n$)-th low comparison voltages is greater than a k-th of the first through ($2^{(n-1)}$)-th low input voltages, and wherein k is a positive integer less than or equal to $2^{(n-1)}$.

2. The test device of claim 1, further comprising:
a voltage generator configured to generate the first through ($2^n$)-th input voltages and the first through ($2^n$)-th comparison voltages.

3. The test device of claim 1, wherein
the first through ($2^{(n-1)}$)-th high input voltages are different from each other by a first voltage difference;
the first through ($2^{(n-1)}$)-th low input voltages are different from each other by a second voltage difference;
the first through ($2^{(n-1)}$)-th high comparison voltages are different from each other by a third voltage difference; and
the first through ($2^{(n-1)}$)-th low comparison voltages are different from each other by a fourth voltage difference.

4. The test device of claim 1, wherein
the first through ($2^n$)-th comparison signals include the first through ($2^{(n-1)}$)-th high comparison signals and the first through ($2^{(n-1)}$)-th low comparison signals;
the comparison circuit includes first through ($2^{(n-1)}$)-th high comparators and first through ($2^{(n-1)}$)-th low comparators;
a k-th of the first through ($2^{(n-1)}$)-th high comparators is configured to,
output a k-th of the first through ($2^{(n-1)}$)-th high comparison signal having a first logic level when the test result signal is greater than or equal to the k-th high comparison voltage, and
output the k-th high comparison signal having a second logic level when the test result signal is less than the k-th high comparison voltage; and
a k-th of the first through ($2^{(n-1)}$)-th low comparator is configured to,
output a k-th of the first through ($2^{(n-1)}$)-th low comparison signals having the first logic level when the test result signal is less than or equal to the k-th low comparison voltage, and
output the k-th low comparison signal having the second logic level when the test result signal is greater than the k-th low comparison voltage.

5. The test device of claim 1, wherein the analysis circuit comprises:
a buffer circuit configured to output first through ($2^n$)-th determination signals based on (i) the first through ($2^n$)-th comparison signals generated by the comparison circuit, and (ii) an active strobe signal outputted by the controller; and
a decoder configured to generate the test result code corresponding to a voltage level of the test result signal based on logic levels of the first through ($2^n$)-th determination signals.

6. The test device of claim 1, wherein the controller is further configured to determine the corrupt area of the device under test based on a comparison between the n-bits of the test result code and the n-bits of the test code.

7. The test device of claim 6, wherein the controller is further configured to determine the corrupt area of the device under test if a m-th bit of the test result code is different from a m-th bit of the test code, m is a positive integer less than or equal to n.

8. The test device of claim 1, further comprising:
a drive channel configured to output a command signal, an address signal, and a clock signal to the device under test; and
wherein the controller is further configured to generate the command signal, the address signal, and the clock signal.

9. The test device of claim 8, wherein the drive channel comprises:
a command driver configured to output the command signal to the device under test via a command pin;
an address driver configured to output the address signal to the device under test via an address pin; and
a clock driver configured to output the clock signal to the device under test via a clock pin.

10. The test device of claim 8, wherein
the command signal corresponds to one of a read command and a write command, the address signal represents a test address; and
the controller is further configured to,
output the test code to the data driver, and
receive the test result code from the analysis circuit.

11. The test device of claim 10, wherein
the controller is further configured to determine the corrupt area of the device under test if a m-th bit of the test result code is different from a m-th bit of the test code;
the corrupt area corresponds to an address greater than the test address by (m−1); and
m is a positive integer less than or equal to n.

12. A test system, comprising:
a device under test; and
a test device configured to,
output one of first through ($2^n$)-th input voltages to the device under test as a test signal, the one of first through ($2^n$)-th input voltages based on a test code having n-bits, n being an integer greater than or equal to two,
generate a test result code based on a comparison between a test result signal and first through ($2^n$)-th comparison voltages, the test result code having n-bits,
and
determine a corrupt area of the device under test based on the test result code; wherein
the first through ($2^n$)-th input voltages include first through ($2^{(n-1)}$)-th high input voltages and first through ($2^{(n-1)}$)-th low input voltages,
the first through ($2^n$)-th comparison voltages include first through ($2^{(n-1)}$)-th high comparison voltages and first through ($2^{(n-1)}$)-th low comparison voltages, a k-th of the first through ($2^{(n-1)}$)-th high comparison voltages is lower than a k-th of the first through ($2^{(n-1)}$)-th high input voltages, a k-th of the first through ($2^{(n-1)}$)-th low comparison voltages is greater than a k-th of the first through ($2^{(n-1)}$)-th low input voltages, and k is a positive integer less than or equal to $2^{(n-1)}$.

13. The test system of claim 12, wherein the test device further comprises:
a storage device configured to store a test sequence;
a controller configured to generate the test code by dividing the test sequence received from the storage device;
a data driver configured to output the one of the first through ($2^n$)-th input voltages to the device under test as the test signal based on the test code;
a comparison circuit configured to generate first through ($2^n$)-th comparison signals based on a comparison between the test result signal and the first through ($2^n$)-th comparison voltages;
an analysis circuit configured to generate the test result code based on the first through ($2^n$)-th comparison signals; and
wherein the controller is further configured to determine the corrupt area of the device under test based on an m-th bit of the test result code.

14. The test system of claim 12, wherein
the test device is further configured to,
output a first test command and the test signal to the device under test,
output a second test command to the device under test; and
the device under test is configured to,
generate a test input code having n-bits based on a voltage level of the test signal,
perform an operation corresponding to the first test command based on the test input code,
generate a test output code having n-bits by performing an operation corresponding to the second test command,
generate the test result signal having a voltage level corresponding to the test output code, and
output the test result signal to the test device.

15. A test device, comprising:
a data driver configured to output a test signal based on a n-bit test code, the test signal being a first voltage pulse having a first voltage level corresponding to the n-bit test code; and
a controller coupled to the data driver, the controller configured to,
generate the n-bit test code, and
identify a corrupt area of a device under test based on a comparison between the n-bit test code and a n-bit test result code, the n-bit test result code based on a test result signal and a plurality of comparison voltages, the test result signal output from the device under test in response to the test signal, and the test result signal being a second voltage pulse having a second voltage level corresponding to the n-bit test result code, n being an integer greater than or equal to two; wherein
the first voltage pulse is one of a plurality of input voltages,
the plurality of input voltages include a plurality of high input voltages and a plurality of low input voltages,
the plurality of comparison voltages include a plurality of high comparison voltages and a plurality of low comparison voltages,
a k-th comparison voltage among the plurality of high comparison voltages is lower than a k-th high input voltage among the plurality of high input voltages, and
a k-th low comparison voltage among the plurality of low comparison voltages is greater than a k-th low input voltage among the plurality of low input voltages.

16. The test device of claim 15, further comprising:
a voltage generator coupled to the data driver, the voltage generator configured to generate the plurality of input voltages.

17. The test device of claim 16, further comprising:
an input-output circuit coupled to the controller, the input-output circuit configured to,
generate the n-bit test result code based on a comparison between the second voltage level of the test result signal and the plurality of comparison voltages; and
output the n-bit test result code to the controller.

18. The test device of claim 17, wherein the input-output circuit comprises:
a comparison circuit configured to generate a plurality of comparison signals based on a comparison between the second voltage level of the test result signal and the plurality of comparison voltages; and
an analysis circuit configured to generate the n-bit test result code based on the plurality of comparison voltages.

19. The test device of claim 18, wherein the analysis circuit is configured to generate the n-bit test result code using a look-up table.

* * * * *